US012647697B2

(12) United States Patent (10) Patent No.: US 12,647,697 B2
Yasufuku (45) Date of Patent: Jun. 2, 2026

(54) IMAGING DEVICE

(71) Applicant: SONY SEMICONDUCTOR SOLUTIONS CORPORATION, Kanagawa (JP)

(72) Inventor: Tadashi Yasufuku, Tokyo (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 71 days.

(21) Appl. No.: 18/710,313

(22) PCT Filed: Nov. 8, 2022

(86) PCT No.: PCT/JP2022/041599
§ 371 (c)(1),
(2) Date: May 15, 2024

(87) PCT Pub. No.: WO2023/100605
PCT Pub. Date: Jun. 8, 2023

(65) Prior Publication Data
US 2025/0016471 A1 Jan. 9, 2025

(30) Foreign Application Priority Data
Dec. 3, 2021 (JP) ................................ 2021-197067

(51) Int. Cl.
*H04N 25/77* (2023.01)
*H10F 39/00* (2025.01)
*H10F 39/18* (2025.01)
(52) U.S. Cl.
CPC ......... *H04N 25/77* (2023.01); *H10F 39/8037* (2025.01); *H10F 39/18* (2025.01)

(58) Field of Classification Search
CPC ...... H04N 25/70; H04N 25/76; H10F 39/813; H10F 39/8033; H10F 39/807; H10F 39/8023; H10F 39/18; H10F 39/8037
See application file for complete search history.

(56) References Cited

U.S. PATENT DOCUMENTS

2022/0359620 A1* 11/2022 Nishio ................... H04N 25/78

FOREIGN PATENT DOCUMENTS

JP 2013-026264 2/2013
JP 2013-062789 4/2013
(Continued)

OTHER PUBLICATIONS

English Translation of International Search Report prepared by the Japan Patent Office on Feb. 3, 2023, for International Application No. PCT/JP2022/041599, 2 pgs.

*Primary Examiner* — Xi Wang
(74) *Attorney, Agent, or Firm* — SHERIDAN ROSS P.C.

(57) ABSTRACT
An imaging device capable of suppressing deterioration in electrical characteristics and improving layout efficiency is provided. The imaging device includes a semiconductor layer and a plurality of pixels provided in the semiconductor layer. Each of the plurality of pixels includes a photoelectric conversion unit, a floating diffusion that converts a charge generated by the photoelectric conversion unit into a voltage signal, and a transfer transistor that transfers the charge generated in the photoelectric conversion unit to the floating diffusion. In one pixel and the other pixel that are adjacent to each other among the plurality of pixels, one or more of the photoelectric conversion unit, the floating diffusion, and the transfer transistor are arranged non-linearly symmetrically and point-symmetrically.

4 Claims, 18 Drawing Sheets

(56)            References Cited

FOREIGN PATENT DOCUMENTS

| JP | 2021-005654 | 1/2021 | | |
| JP | 2021005654 A | * | 1/2021 | ............ H04N 25/79 |

* cited by examiner

Fig. 1

IMAGING DEVICE

CROSS REFERENCE TO RELATED APPLICATIONS

This application is a national stage application under 35 U.S.C. 371 and claims the benefit of PCT Application No. PCT/JP2022/041599, having an international filing date of 8 Nov. 2022, which designated the United States, which PCT application claimed the benefit of Japanese Patent Application No. 2021-197067, filed 3 Dec. 2021, the entire disclosures of each of which are incorporated herein by reference.

TECHNICAL FIELD

The present disclosure relates to an imaging device.

BACKGROUND ART

A CMOS image sensor is known as an imaging device that includes a photodiode and a transistor that reads out the charge photoelectrically converted by the photodiode. For example, PTL 1 discloses "a solid-state imaging device including: a plurality of photoelectric conversion units; a floating diffusion that is shared by the plurality of photoelectric conversion units and converts the charge generated in each of the plurality of photoelectric conversion units into a voltage signal; a plurality of transfer units each provided for each of the plurality of photoelectric conversion units and transferring the charges generated in the plurality of photoelectric conversion units to the floating diffusion; a first transistor group electrically connected to the floating diffusion and having gates and sources/drains arranged in a first layout configuration; and a second transistor group electrically connected to the floating diffusion, having gates and sources/drains arranged in a second layout configuration symmetrical to the first layout configuration, and provided in a region different from the first transistor group."

CITATION LIST

Patent Literature

PTL 1: JP 2013-62789A

SUMMARY

Technical Problem

In the technique disclosed in PTL 1, as shown in FIG. 1 and the like, one pixel and the other pixel that are adjacent to each other are arranged linearly symmetrically and point-symmetrically in a plan view. If adjacent pixels are arranged linearly symmetrically and point-symmetrically, for example, the arrangement of paths (saddle points) for overflowing electrons when a photodiode is saturated will also be linearly symmetrical, and the saddle points of adjacent pixels are likely to be arranged close to each other at the boundary. In such an arrangement, for example, when transferring the signal charge of one pixel (that is, when the transfer gate of one pixel is ON), the saddle point of the other pixel is modulated, and the saturation signal charge amount of the other pixel (Qs) may be changed. If Qs fluctuates unintentionally, the electrical characteristics of the imaging device may deteriorate.

Additionally, if the photodiodes and transfer gates that constitute the pixels are arranged linearly symmetrically and point-symmetrically between adjacent pixels, it may sometimes be difficult to design these photodiodes and transfer gates to be widened toward the pixel boundary.

For example, if the photodiode of one pixel is arranged to be widened to the vicinity of the pixel boundary, the photodiode of the other pixel, which has a linearly symmetrical and point-symmetric relationship with respect to the one pixel, will also be arranged to be widened to the vicinity of the pixel boundary, and the photodiodes of the adjacent pixels will be arranged close to each other at the pixel boundary. Since there is a limitation in design rule on the separation distance between photodiodes, it is difficult for the photodiodes to be widened to the vicinity of the pixel boundary. It is desired to improve layout efficiency to solve this problem.

The present disclosure has been made in view of these circumstances, and an object of the present disclosure is to provide an imaging device that can suppress deterioration in electrical characteristics and improve layout efficiency.

Solution to Problem

An imaging device according to one aspect of the present disclosure includes a semiconductor layer and a plurality of pixels provided in the semiconductor layer. Each of the plurality of pixels includes a photoelectric conversion unit, a floating diffusion that converts a charge generated by the photoelectric conversion unit into a voltage signal, and a transfer transistor that transfers the charge generated in the photoelectric conversion unit to the floating diffusion. In one pixel and the other pixel that are adjacent to each other among the plurality of pixels, one or more of the photoelectric conversion unit, the floating diffusion, and the transfer transistor are arranged non-linearly symmetrically and point-symmetrically.

According to this configuration, the arrangement of saddle points is dispersed between adjacent pixels, and the saddle points can be separated from each other. In this way, it is possible to suppress the saddle point of the other pixel from being modulated when the signal charge of one pixel is transferred, and it is possible to suppress the fluctuation of the saturation signal charge amount (Qs) of the other pixel. In this way, it is possible to suppress deterioration in electrical characteristics due to unintended fluctuations in Qs. In addition, since it is easy to design the gate electrodes of the photoelectric conversion units and transfer transistors constituting the pixels so as to be widened toward the pixel boundary between adjacent pixels, layout efficiency can be improved.

BRIEF DESCRIPTION OF DRAWINGS

FIG. 1 is a block diagram showing a configuration example of an imaging device according to a first embodiment of the present disclosure.

DESCRIPTION OF EMBODIMENTS

Figure 2:
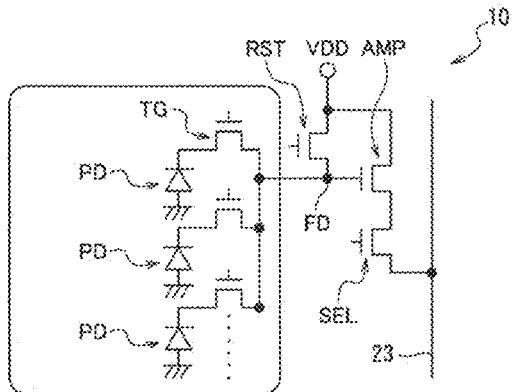
FIG. 2 is a circuit diagram illustrating a configuration example of a shared pixel unit of the imaging device according to the first embodiment of the present disclosure.

Embodiments of the present disclosure will be described below with reference to the drawings. In descriptions of the drawings referred to in the following description, same or similar portions will be denoted by same or similar reference signs. However, it should be noted that the drawings are schematic, and the relationships between thicknesses and planar dimensions, ratios of thicknesses of respective layers, and the like are different from actual ones. Therefore, specific thicknesses and dimensions should be determined by considering the following descriptions. In addition, it is of course that the drawings include portions where mutual dimensional relationships and ratios differ between the drawings.

It is to be understood that definitions of directions such as upward, downward, and the like in the following description are merely definitions provided for the convenience of explanation and are not intended as limiting technical ideas of the present disclosure. For example, it is obvious that when an object is observed after being rotated by 90 degrees, up-down is converted into and interpreted as left-right, and when an object is observed after being rotated by 180 degrees, up-down is interpreted as being inverted.

In the following description, the directions may be explained using terms such as the X-axis direction, the Y-axis direction, and the Z-axis direction. For example, the X-axis direction and the Y-axis direction are directions parallel to a front surface 11a of a semiconductor substrate 11 (see FIG. 5, which will be described later). The X-axis direction and the Y-axis direction are also referred to as "horizontal directions". The Z-axis direction is the normal direction of the front surface 11a of the semiconductor substrate 11. The X-axis direction, the Y-axis direction, and the Z-axis direction are directions orthogonal to each other.

In the following description, "plan view" means, for example, viewing from the thickness direction of the semiconductor substrate 11 (that is, the normal direction of the front surface 11a or the back surface of the semiconductor substrate 11, and the Z-axis direction).

In the following description, a case where the first conductivity type is P type and the second conductivity type is N type will be exemplified. However, the conductivity types may be selected in a reverse relationship, the first conductivity type being the N type and the second conductivity type being the P type. In addition, the "+" added to P or N means that the semiconductor layer has a relatively higher impurity concentration than a semiconductor layer without a "+" added. However, even if the semiconductor layers are marked with the same P and P, this does not mean that the impurity concentrations of the respective semiconductor layers are strictly the same.

First Embodiment (Example of Overall Configuration of Imaging Device)

Figure 1:
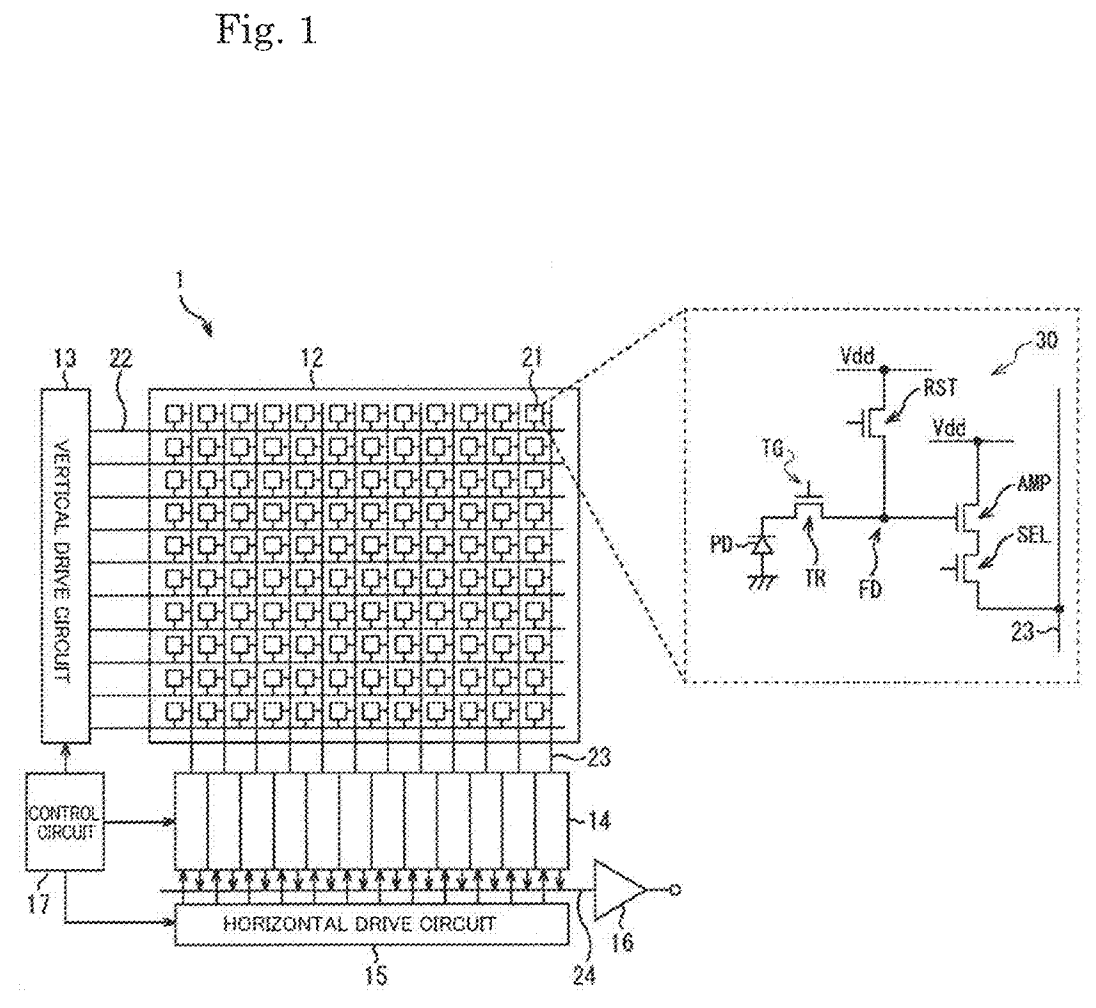

FIG. 1 is a block diagram showing a configuration example of an imaging device 1 according to the first embodiment of the present disclosure. As shown in FIG. 1, the imaging device 1 includes a semiconductor substrate 11 (an example of a "semiconductor layer" according to the present disclosure) 1, a pixel region 12 provided on the semiconductor substrate 11, a vertical drive circuit 13, a column signal processing circuit 14, a horizontal drive circuit 15, an output circuit 16, and a control circuit 17. The vertical drive circuit 13, the column signal processing circuit 14, the horizontal drive circuit 15, the output circuit 16, and the control circuit 17 may be provided on the semiconductor substrate 11, or may be provided on a second semiconductor substrate disposed on the front surface side of the (first) semiconductor substrate 11 via a multilayer wiring layer composed of a wiring layer and an interlayer insulating film (none of which is shown).

The pixel region 12 is a light receiving region that receives light collected by an optical system (not shown), and includes a plurality of pixels 21. The plurality of pixels 21 are arranged in a matrix. The plurality of pixels 21 are connected to the vertical drive circuit 13 on a row-by-row basis via horizontal signal lines 22 and are connected to the column signal processing circuit 14 on a column-by-column basis via vertical signal lines 23. Each of the plurality of pixels 21 outputs a pixel signal at a level corresponding to the amount of light it receives. An image of a subject is constructed from these pixel signals.

The vertical drive circuit 13 supplies drive signals for driving (transferring, selecting, resetting, or the like) the pixels 21 sequentially for each row of the plurality of pixels 21 to the pixels 21 via the horizontal signal lines 22. The column signal processing circuit 14 performs CDS (Correlated Double Sampling) processing on the pixel signals output from the plurality of pixels 21 via the vertical signal lines 23 to thereby perform AD conversion on the pixel signals and remove reset noise.

The horizontal drive circuit 15 sequentially supplies the column signal processing circuit 14 with a drive signal for causing the column signal processing circuit 14 to output a pixel signal to the data output signal line 24 for each column of the plurality of pixels 21. The output circuit 16 amplifies the pixel signal supplied from the column signal processing circuit 14 via the data output signal line 24 at a timing according to the drive signal of the horizontal drive circuit 15, and outputs it to the subsequent signal processing circuit. The control circuit 17 controls the driving of each block inside of the imaging device 1. For example, the control circuit 17 generates a clock signal according to the drive cycle of each block and supplies it to each block.

The pixel 21 includes a photodiode PD (an example of a "photoelectric conversion unit" in the present disclosure), a transfer transistor TR, a floating diffusion FD, an amplification transistor AMP, a selection transistor SEL, and a reset transistor RST. The transfer transistor TR, floating diffusion FD, amplification transistor AMP, selection transistor SEL, and reset transistor RST constitute a readout circuit 30 that reads out the charge (pixel signal) photoelectrically converted by the photodiode PD.

The photodiode PD is a photoelectric conversion unit that photoelectrically converts incident light into charges and stores them, and has an anode terminal grounded and a cathode terminal connected to the transfer transistor TR. A transfer signal is supplied from the vertical drive circuit 13 to the gate electrode TG of the transfer transistor TR. The transfer transistor TR is driven according to a transfer signal supplied to the transfer gate TG. Hereinafter, the gate electrode TG will also be referred to as a transfer gate. When the transfer transistor TR is turned on, the charges stored in the photodiode PD are transferred to the floating diffusion FD. The floating diffusion FD is a floating diffusion region having a predetermined storage capacity connected to the gate electrode of the amplification transistor AMP, and temporarily stores charges transferred from the photodiode PD.

The amplification transistor AMP outputs a pixel signal at a level corresponding to the charge stored in the floating diffusion FD (that is, the potential of the floating diffusion FD) to the vertical signal line 23 via the selection transistor SEL. That is, due to the configuration in which the floating diffusion FD is connected to the gate electrode of the amplification transistor AMP, the floating diffusion FD and the amplification transistor AMP function as a conversion unit that amplifies the charge generated in the photodiode PD and converts it into a pixel signal of a level corresponding to the charge.

The selection transistor SEL is driven in accordance with a selection signal supplied from the vertical drive circuit 13, and when the selection transistor SEL is turned on, the pixel signal output from the amplification transistor AMP becomes ready to be output to the vertical signal line 23. The reset transistor RST is driven according to a reset signal supplied from the vertical drive circuit 13, and when the reset transistor RST is turned on, the charges stored in the floating diffusion FD are discharged to the power supply line Vdd, and the floating diffusion FD is reset.

FIG. 2 is a circuit diagram showing a configuration example of a shared pixel unit 10 of the imaging device 1 according to the first embodiment of the present disclosure. As shown in FIG. 2, in the imaging device 1, the photodiodes PD and transfer transistors TR of a plurality of pixels 21 may be connected in parallel to form a shared pixel unit

10. In the shared pixel unit, for example, the photodiodes PD of each pixel 21 included in the shared pixel unit are connected to one floating diffusion FD via the transfer transistor TR of each pixel 21.

(Example of Pixel Configuration)

Figure 3:
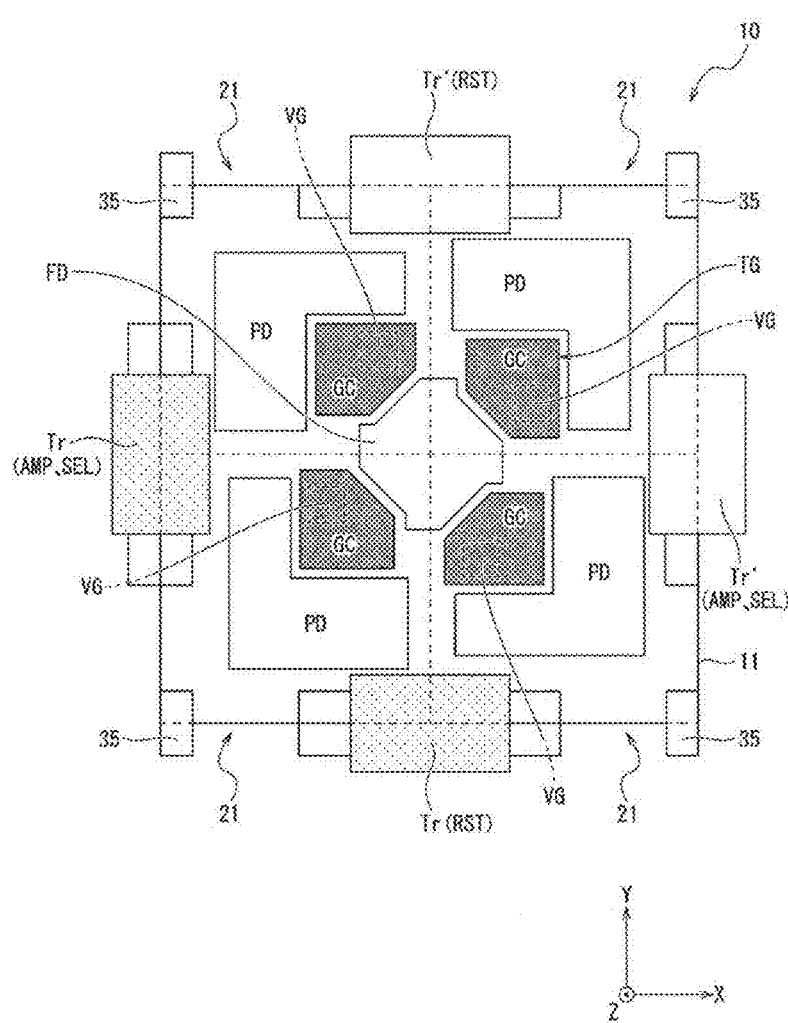
FIG. 3 is a plan view showing a configuration example of the shared pixel unit of the imaging device according to the first embodiment of the present disclosure.

FIG. 3 is a plan view showing a configuration example of the shared pixel unit 10 of the imaging device 1 according to the first embodiment of the present disclosure. In the example shown in FIG. 3, a total of four pixels 21, two each arranged in the horizontal direction (for example, the X-axis direction) and the vertical direction (for example, the Y-axis direction), form one shared pixel unit 10. The shared pixel unit 10 shown in FIG. 3 is also called a 2×2-type shared pixel unit because of the number of shared pixels and their arrangement.

As shown in FIG. 3, the 2×2-type shared pixel unit 10 includes four photodiodes PD, four transfer transistors TR, one shared floating diffusion FD, and a shared pixel transistor Tr. The pixel transistor Tr is an N-type MOS transistor provided in a P-type well region 31, and includes a selection transistor SEL (see FIG. 2), a reset transistor RST (see FIG. 2), and an amplification transistor AMP (see FIG. 2). Furthermore, the pixel transistor Tr may include a dummy transistor that is not electrically connected to other elements (or does not operate as a switch even if it is electrically connected).

The pixel transistor Tr is electrically isolated from other surrounding elements and impurity diffusion layers by, for example, a trench isolation 33 provided on the front surface 11a side of the semiconductor substrate 11.

Furthermore, the P-type well region 31 is fixed at a preset potential via, for example, a P-type contact region 35 provided on the front surface 11a side of the semiconductor substrate 11.

Note that a pixel transistor Tr' shown in FIG. 3 is included in another shared pixel unit (not shown) adjacent to the shared pixel unit 10 shown in FIG. 3.

The floating diffusion FD is arranged at the center portion of the four pixels 21 constituting the shared pixel unit 10 in a plan view. The gate electrode (that is, the transfer gate) TG of the transfer transistor TR is arranged near the floating diffusion FD. The four transfer gates TG are arranged so as to surround one floating diffusion FD in a plan view.

An inter-pixel separation portion 40 (see FIG. 5 described below) is provided on the outer periphery of each pixel 21 constituting the shared pixel unit 10. The inter-pixel separation portion 40 is, for example, an impurity diffusion layer 41 (see FIG. 5 described later) of a conductivity type different from the N-type semiconductor substrate 11 (that is, P type), or a trench isolation 43 (see FIG. 5 described later), or a combination thereof.

In FIG. 3, the upper side in the vertical direction of the sheet surface is the front surface side of the semiconductor substrate 11, and a multilayer wiring layer composed of a plurality of wiring layers and an interlayer insulating film (none of which is shown) is provided on the front surface side. On the other hand, in FIG. 3, the lower side in the vertical direction of the sheet surface is the back surface side of the semiconductor substrate 11, which is the light incident surface on which light is incident, and an on-chip lens, a color filter, and the like (none of which are shown) are provided on the back surface side. The imaging device 1 is a back-illuminated CMOS image sensor which photoelectrically converts light incident from the back surface side of the semiconductor substrate 11.

Figure 4:
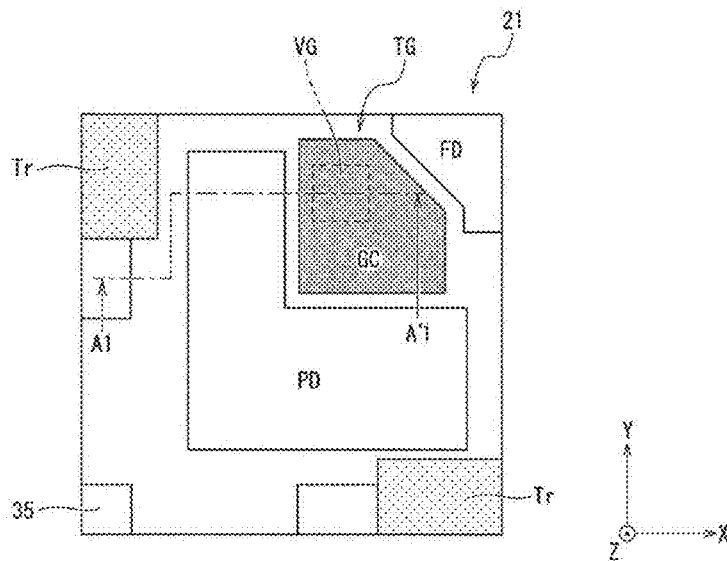
FIG. 4 is a plan view showing an example of the configuration of a pixel according to the first embodiment of the present disclosure.
Figure 5:
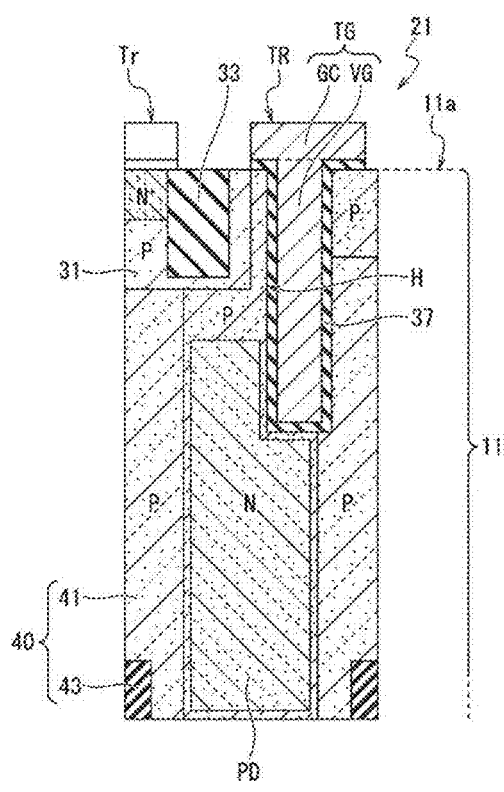
FIG. 5 is a cross-sectional view showing a configuration example of a pixel according to the first embodiment of the present disclosure.

FIG. 4 is a plan view showing a configuration example of the pixel 21 according to the first embodiment of the present disclosure. FIG. 5 is a cross-sectional view showing a configuration example of the pixel 21 according to the first embodiment of the present disclosure. FIG. 5 schematically shows a cross-section of FIG. 4 taken along line A1-A'1. The semiconductor substrate 11 is, for example, a single-crystal silicon substrate or a single-crystal silicon layer formed by an epitaxial growth method on a substrate (not illustrated). As shown in FIG. 5, the conductivity type of the semiconductor substrate 11 is, for example, P type.

As shown in FIGS. 4 and 5, the photodiode PD is provided inside of the P-type semiconductor substrate 11. The photodiode PD is constituted of, for example, an N-type impurity diffusion layer. The photodiode PD photoelectrically converts incident light that is incident from the rear surface side of the semiconductor substrate 11 and stores an obtained electric charge $e^-$.

The transfer transistor TR is provided from the inside of the semiconductor substrate 11 to the front surface 11a (an example of the "first surface" of the present disclosure). The transfer transistor TR has, for example, a gate electrode (transfer gate) TG and a gate insulating film 37 provided between the transfer gate TG and the semiconductor substrate 11, and is an N-type vertical transistor in which the photodiode PD is used as the source and the floating diffusion FD is used as the drain. The transfer transistor TR transfers the charge e-generated by the photodiode PD from the photodiode PD to the floating diffusion FD.

The floating diffusion FD is provided on the front surface 11a side of the semiconductor substrate 11 and is constituted of, for example, an N-type impurity diffusion layer. The floating diffusion FD holds the charge $e^-$ transferred from the transfer transistor TR.

The structure of the transfer transistor TR will be explained in more detail. The semiconductor substrate 11 is provided with a hole H1 that opens toward the front surface 11a and is adjacent to the photodiode PD. The transfer gate TG has a vertical gate electrode VG (an example of the "first portion" of the present disclosure) disposed in the hole H1 via the gate insulating film 37 and provided to extend in a direction vertical to the front surface 11a of the semiconductor substrate 11 and a horizontal gate electrode GC (an example of the "second portion" in the present disclosure) disposed on the front surface 11a of the semiconductor substrate 11 via the gate insulating film 37 and provided to extend in a direction horizontal to the front surface 11a of the semiconductor substrate 11. The vertical gate electrode VG and the horizontal gate electrode GC are connected to each other. For example, the vertical gate electrode VG and the horizontal gate electrode GC are integrally formed to constitute one transfer gate TG. The vertical gate electrode VG and the horizontal gate electrode GC are made of, for example, polysilicon doped with N-type impurities. The N-type impurity is, for example, phosphorus or arsenic.

The gate insulating film 37 includes a first film portion provided between the inner wall of the hole H1 and the vertical gate electrode VG and a second film portion arranged between the front surface 11a of the semiconductor substrate 11 and the horizontal gate electrode GC. The first film portion and the second film portion of the gate insulating film 37 are silicon oxide films formed by thermally oxidizing the semiconductor substrate 11, and are integrally formed.

The charge $e^-$ generated by photoelectric conversion in the photodiode PD is transferred vertically along the vertical gate electrode VG of the transfer transistor TR, and then laterally transferred along the horizontal gate electrode GC to reach the floating diffusion FD. When the charge $e^-$ is transferred from the photodiode PD to the floating diffusion FD, the charge $e^-$ moves along the side surface of the vertical gate electrode VG so as to go around the vertical gate electrode VG.

Although not shown, a charge transfer channel may be provided in a region of the semiconductor substrate 11, facing the vertical gate electrode VG with the gate insulating film 37 therebetween. In addition, in the semiconductor substrate 11, a charge transfer channel may also be provided in a region facing the horizontal gate electrode GC with the gate insulating film 37 therebetween. The charge transfer channel is made of, for example, a P-type impurity diffusion layer. By providing a charge transfer channel in the above-mentioned region, it is possible to adjust various characteristics of the transfer transistor (for example, threshold voltage, withstand voltage when turned off, and the like) to desired values.

Furthermore, the pixel 21 has an inter-pixel separation portion 40 at the boundary between the pixel 21 and another adjacent pixel 21. For example, the inter-pixel separation portion 40 includes an impurity diffusion layer 41 of a conductivity type different from the N-type semiconductor substrate 11 (for example, P-type) and a trench isolation 43 extending in the thickness direction from the back surface side of the semiconductor substrate 11. The trench isolation 43 is arranged within the P-type impurity diffusion layer 41.

(Non-Linearly Symmetrical and Point-Symmetrical Arrangement)

(1) Configuration Example of First Embodiment

Figure 6:
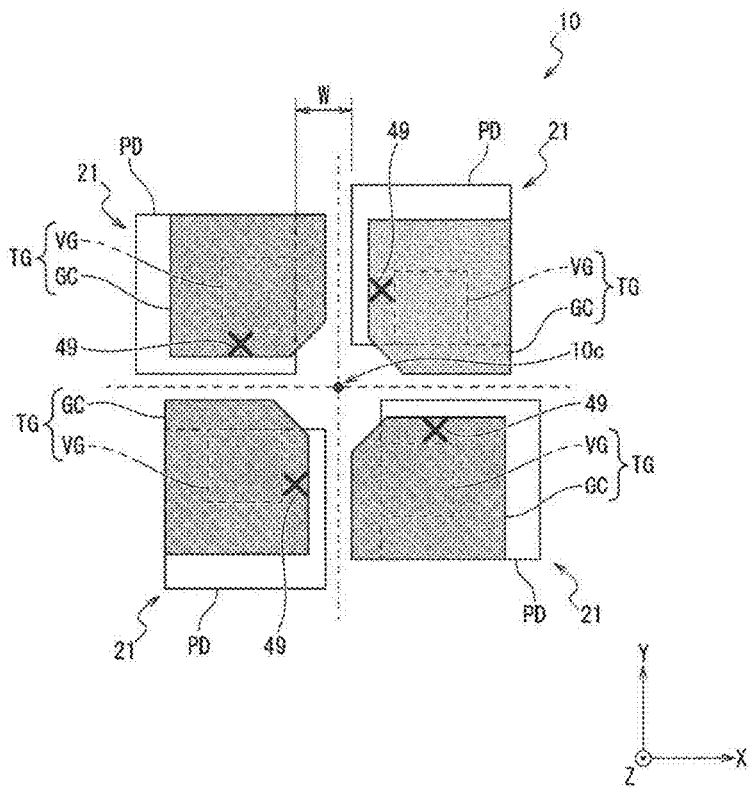
FIG. 6 is a plan view showing an example of the arrangement of transfer gates and photodiodes in shared pixel units according to the first embodiment of the present disclosure.

FIG. 6 is a plan view showing an example of the arrangement of transfer gates TG and photodiodes PD in the shared pixel unit 10 according to the first embodiment of the present disclosure. As shown in FIG. 6, in the shared pixel unit 10 according to the first embodiment, the four transfer gates TG are arranged not in linearly symmetrically but in point-symmetrically, that is, in non-linearly symmetrically and point-symmetrically. The four transfer gates TG are not arranged in a horizontally symmetrical (or vertically symmetrical) arrangement with respect to a straight line passing through the center portion CNT of the shared pixel unit 10 in a plan view. The four transfer gates TG are arranged point-symmetrically with respect to the center portion CNT of the shared pixel unit 10 in a plan view.

To explain in more detail, the four vertical gate electrodes VG are not arranged horizontally symmetrically (or vertically symmetrically) with respect to a straight line passing through the center portion CNT of the shared pixel unit 10 in a plan view. The four vertical gate electrodes VG are arranged point-symmetrically with respect to the center portion CNT of the shared pixel unit 10 in a plan view. The four horizontal gate electrodes GC are not arranged in a horizontally symmetrical (or vertically symmetrical) arrangement with respect to a straight line passing through the center portion CNT of the shared pixel unit 10 in a plan view. The four horizontal gate electrodes GC are arranged point-symmetrically with respect to the center portion CNT of the shared pixel unit 10 in a plan view.

In addition, as shown in FIG. 6, in the shared pixel unit 10, the four photodiodes PD are also arranged not in linearly symmetrically but in point-symmetrically, that is, in non-linearly symmetrically and point-symmetrically. The four photodiodes PD are not arranged in a horizontally symmetrical (or vertically symmetrical) arrangement with respect to a straight line passing through the center portion CNT of the shared pixel unit 10 in a plan view. The four photodiodes PD are arranged point-symmetrically with respect to the center portion 10c of the shared pixel unit 10 in a plan view.

In this way, for example, the interval W between one adjacent photodiode PD and the other photodiode PD can be made wider than the interval W' (see FIG. 7) in a comparative example described later. In this way, it is possible to arrange, for example, an impurity diffusion layer (for example, a part of a photodiode) or a structure forming the pixel 21 near the pixel boundary. Furthermore, it is possible to separate the saddle points 49 of adjacent pixels (that is, to disperse the saddle points 49).

Note that the floating diffusion FD is formed in self-alignment with respect to the horizontal gate electrode GC. Therefore, when the horizontal gate electrodes GC are disposed non-linearly symmetrically and point-symmetrically, the outer peripheral edge of the floating diffusion FD can be formed in a shape that is non-linearly symmetrical and point-symmetrical in a plan view.

(2) Comparative Example

Figure 7:
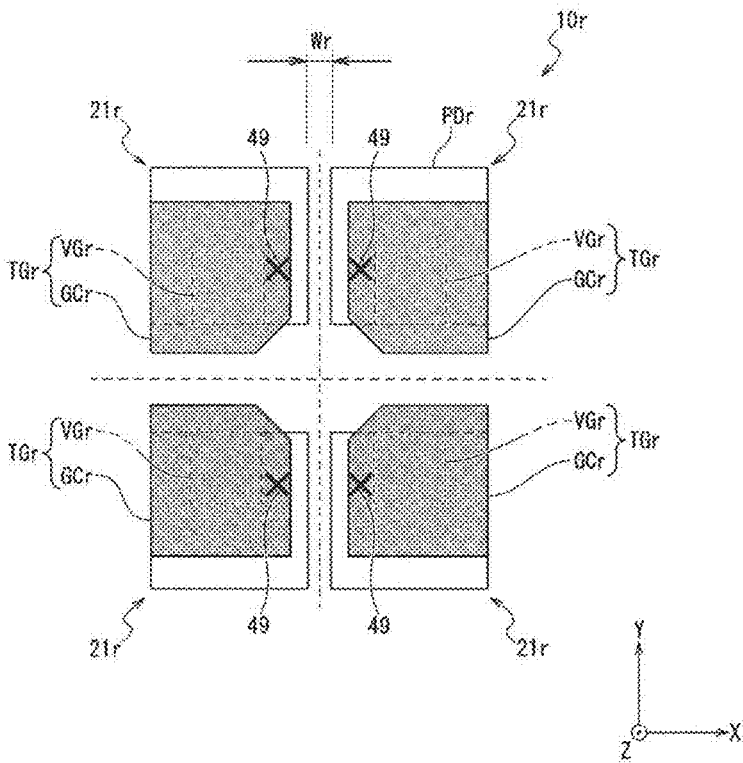
FIG. 7 is a plan view showing an example of the arrangement of transfer gates and photodiodes in shared pixel units according to a comparative example of the present disclosure.

FIG. 7 is a plan view showing an example of the arrangement of a transfer gate TGr and a photodiode PDr in a shared pixel unit 10r according to the comparative example of the present disclosure. As shown in FIG. 7, in the shared pixel unit 10r according to the comparative example, the four transfer gates TGr are arranged linearly symmetrically and point-symmetrically. The four transfer gates TGr are arranged in a horizontally symmetrical (or vertically symmetrical) arrangement with respect to a straight line passing through the center portion 10rc of the shared pixel unit 10r in a plan view. The four transfer gates TGr are arranged point-symmetrically with respect to the center portion 10rc of the shared pixel unit 10 in a plan view.

(3) Comparison

As can be seen by comparing FIGS. 6 and 7, in the configuration example of the first embodiment, the interval W between one adjacent photodiode PD and the other photodiode PD is wider than the interval Wr of the comparative example. As a result, in the configuration example of the first embodiment, structures such as the photodiode PD and the transfer gate TG that constitute the pixel 21 can be arranged near the pixel boundary. In addition, in the configuration example of the first embodiment, compared to the comparative example, the saddle point 49 of one adjacent pixel 21 and the saddle point 49 of the other pixel 21 can be separated from each other.

(4) Saddle Point

Figure 8:
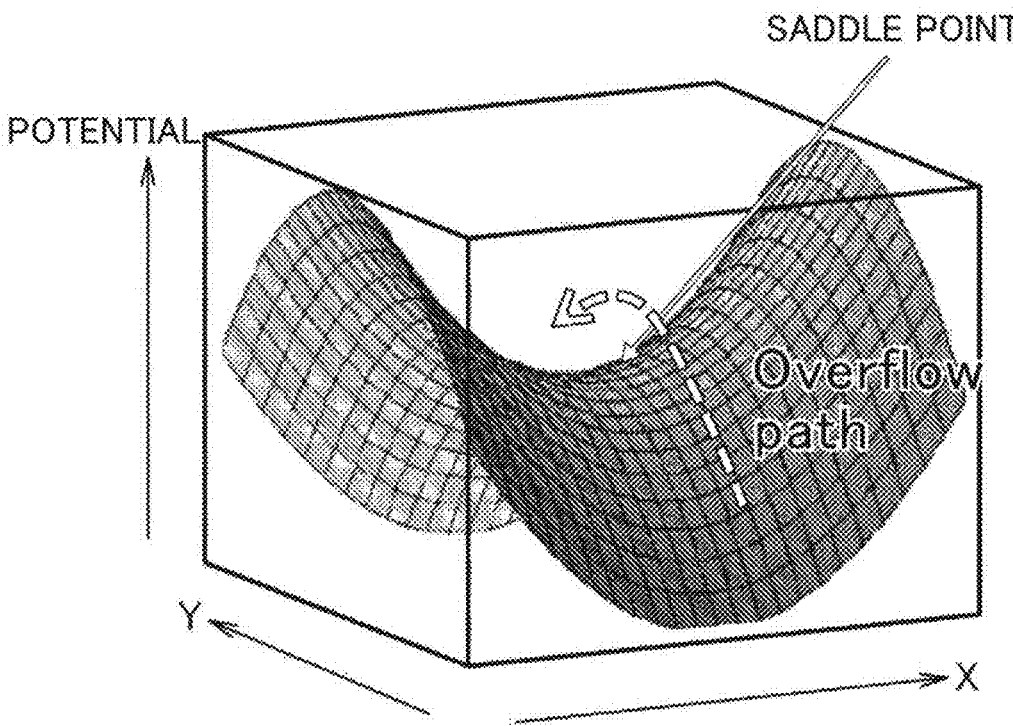
FIG. 8 is a three-dimensional diagram illustrating a saddle point.
Figure 9:
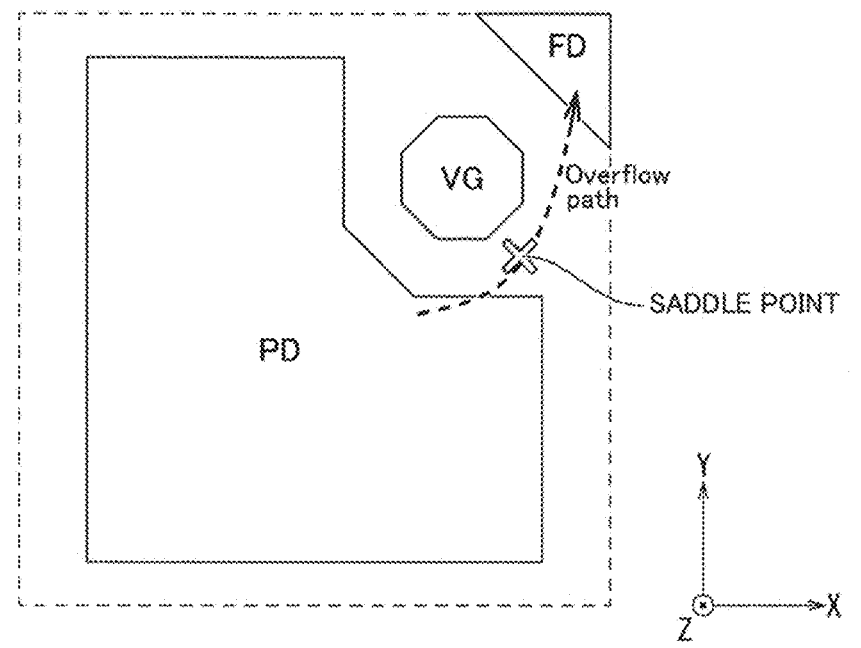
FIG. 9 is a plan view illustrating a saddle point formed between a photodiode and a floating diffusion.

A supplementary explanation about the saddle point will be given. FIG. 8 is a three-dimensional diagram illustrating a saddle point. FIG. 9 is a plan view illustrating a saddle point formed between the photodiode PD and the floating diffusion FD. As shown in FIG. 8, a saddle point means a location sandwiched between a ridge and a valley in terms of potential level. In a back-illuminated CMOS image sensor, when one photodiode PD is filled with electrons between adjacent pixels, electrons overflow to the photodiode PD so that the electrons do not leak to the other photodiode PD. The overflow potential level and the overflow path are determined at the saddle point, as shown in FIG. 9.

If this saddle point is modulated during the operation of adjacent pixels, this will lead to variations in Qs (saturation charge amount). In the first embodiment of the present disclosure, since the saddle points 49 are dispersed as described above, it is possible to suppress modulation of the saddle point 49 of the other pixel 21 when one adjacent pixel 21 operates. In this way, it is possible to suppress variations in Qs (saturation charge amount) in the photodiode PD of each pixel 21.

(Effects of First Embodiment)

As described above, the imaging device 1 according to the first embodiment of the present disclosure includes the semiconductor substrate 11 and the plurality of pixels 21 provided on the semiconductor substrate 11. Each of the plurality of pixels 21 includes a photodiode PD, a floating diffusion FD that converts the charge generated by the photodiode PD into a voltage signal, and a transfer transistor TR that transfers the charge generated by the photodiode PD to the floating diffusion FD. Among the plurality of pixels 21, in one pixel 21 and the other pixel 21 that are adjacent to each other, one or more of the photodiode PD, the floating diffusion, and the transfer transistor TR are arranged non-linearly and point-symmetrically.

According to this configuration, the arrangement of the saddle points 49 is dispersed between adjacent pixels 21, and the saddle points 49 can be separated from each other. As a result, it is possible to suppress modulation of the saddle point 49 of the other pixel 21 when the signal charge of one pixel 21 is transferred (that is, when the transfer gate of one pixel 21 is ON), and fluctuations in the saturation signal charge amount (Qs) of the other pixel 21 (that is, unintended fluctuations in Qs) can be suppressed. In this way, it is possible to suppress deterioration in electrical characteristics (for example, dynamic range, SN ratio) due to unintended fluctuations in Qs.

In addition, between adjacent pixels 21, structures such as the photodiodes PD and transfer gates TG constituting the pixels 21 can be easily designed to be widened toward the pixel boundary (for example, the inter-pixel separation portion 40). For example, the direction in which the photodiode PD of one pixel 21 is widened toward the pixel boundary and the direction in which the photodiode PD of the other pixel 21 is widened toward the pixel boundary are different from each other, and the photodiodes PD are prevented from coming close to each other. It becomes easy to increase the design size of the photodiode PD. The same applies to the transfer gate TG. In this way, layout efficiency can be improved.

MODIFIED EXAMPLE

(1) First Modified Example

Figure 10:
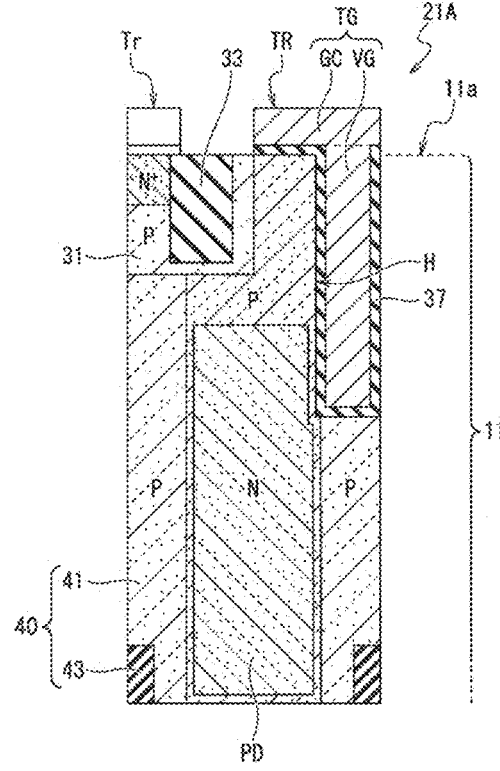
FIG. 10 is a cross-sectional view showing the configuration of a pixel according to a first modified example of the first embodiment of the present disclosure.
Figure 11:
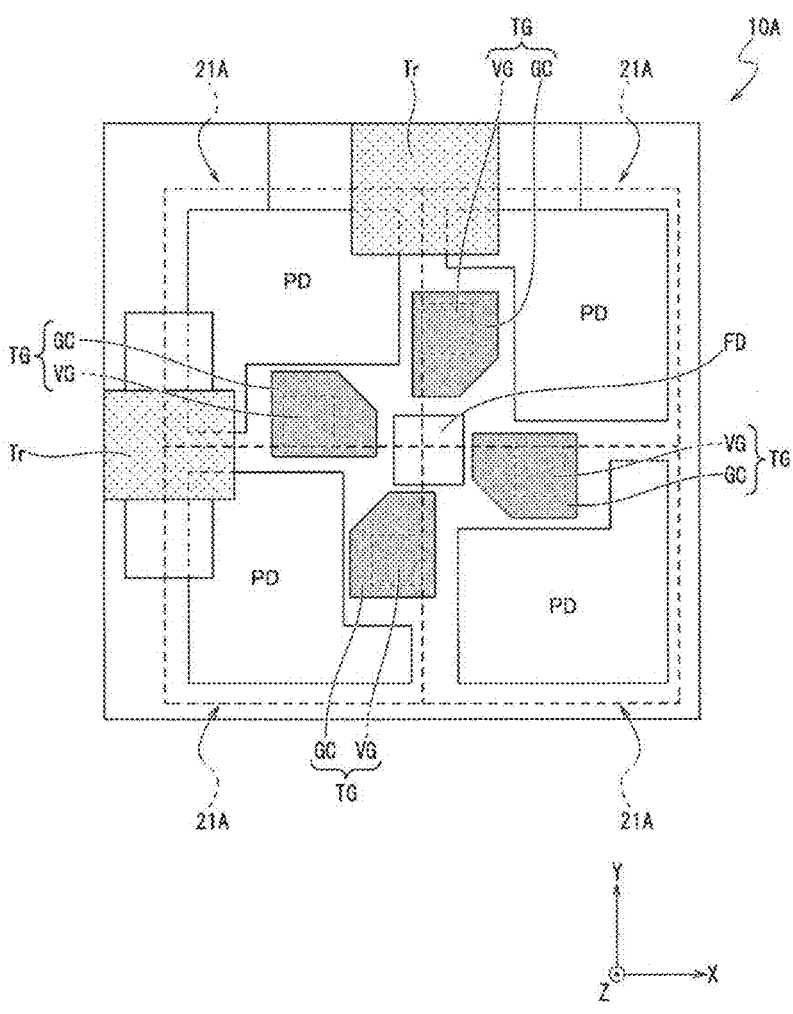
FIG. 11 is a plan view showing the configuration of a shared pixel unit according to the first modified example of the first embodiment of the present disclosure.

FIG. 10 is a cross-sectional view showing the configuration of a pixel 21A according to a first modified example of the first embodiment of the present disclosure. FIG. 11 is a plan view showing the configuration of a shared pixel unit 10A according to the first modified example of the first embodiment of the present disclosure. As shown in FIGS. 10 and 11, the vertical gate electrode VG of the transfer gate TG may be arranged at a position overlapping the inter-pixel separation portion 40 or at a position adjacent to the inter-pixel separation portion 40.

According to this configuration, the area of the photodiode PD can be widened in each pixel 21, so that, for example, Qs (saturation charge amount) can be increased. In addition, a portion of the vertical gate electrode VG may be embedded in the trench isolation 33. In this way, the parasitic capacitance of the vertical gate electrode VG can be reduced.

(2) Second Modified Example

Figure 12:
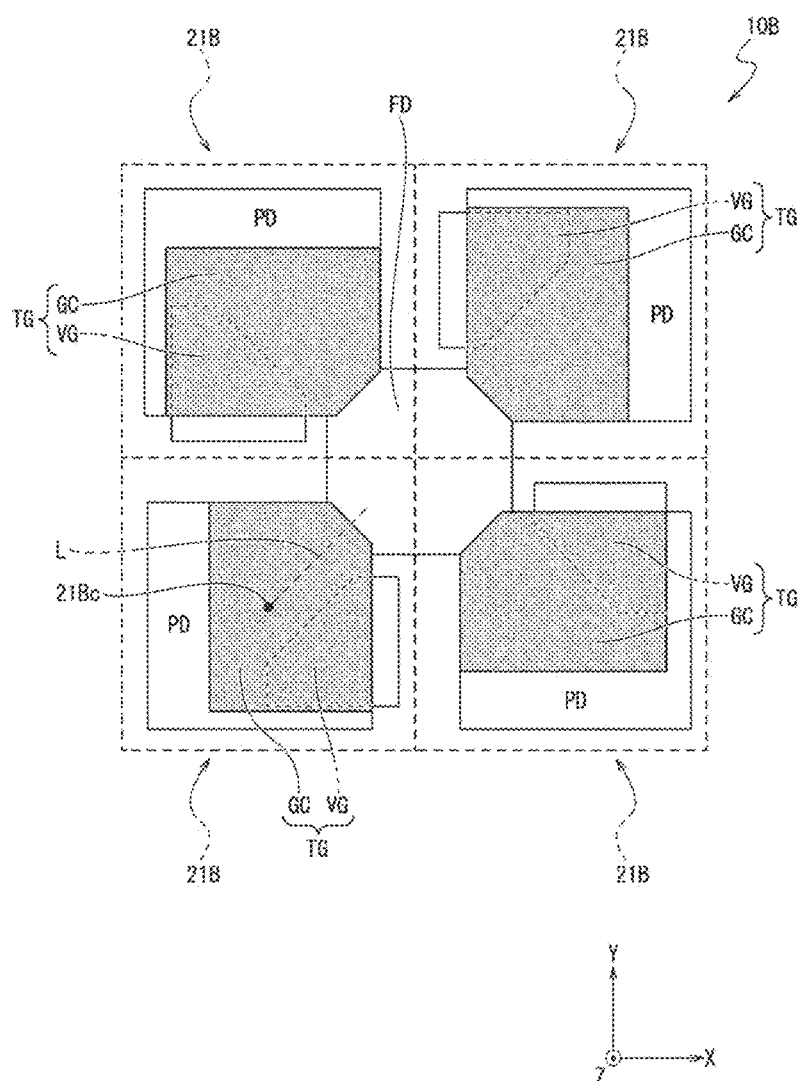
FIG. 12 is a plan view showing the configuration of a shared pixel unit according to a second modified example of the first embodiment of the present disclosure.

FIG. 12 is a plan view showing the configuration of a shared pixel unit 10B according to a second modified example of the first embodiment of the present disclosure. As shown in FIG. 12, the vertical gate electrode VG may be arranged at a position away from the shortest straight line (imaginary line) L connecting the center portion 21Bc of the pixel 21 and the floating diffusion FD in a plan view. According to this configuration, since there is no vertical gate electrode VG on the charge transfer path from the photodiode PD to the floating diffusion FD, and the vertical gate electrode VG does not impede the charge transfer, it becomes easy to read charges from the photodiode PD to the floating diffusion FD.

In addition, as shown in FIG. 12, in the shared pixel unit 10B, the four vertical gate electrodes VG are arranged not linearly symmetrically but point-symmetrically, that is, non-linearly symmetrically and point-symmetrically. In this way, the distance between the four vertical gate electrodes VG can be increased. Furthermore, the four vertical gate electrodes VG are each arranged at a position overlapping the inter-pixel separation portion 40 or at a position adjacent to the inter-pixel separation portion 40. In this way, as shown in FIG. 12, the vertical gate electrode VG can be made larger in each pixel 21.

Since the vertical gate electrode VG can be made larger, the shape of the vertical gate electrode VG in a plan view can be polygonal rather than circular or rectangular. For example, as shown in FIG. 12, the vertical gate electrode VG may have a pentagonal shape in a plan view, and the side surface corresponding to one side of the pentagon may be arranged along the shortest straight line (imaginary line) L. In this way, charge can be transferred from the center portion 21Bc of the pixel 21 to the floating diffusion FD along the side surface of the vertical gate electrode VG, so that charge transfer efficiency can be improved.

Second Embodiment

In the first embodiment described above, it has been described that the imaging device 1 has a 2×2-type shared pixel unit 10. However, in the embodiments of the present disclosure, the shared pixel unit is not limited to a 2×2 type.

Figure 13:
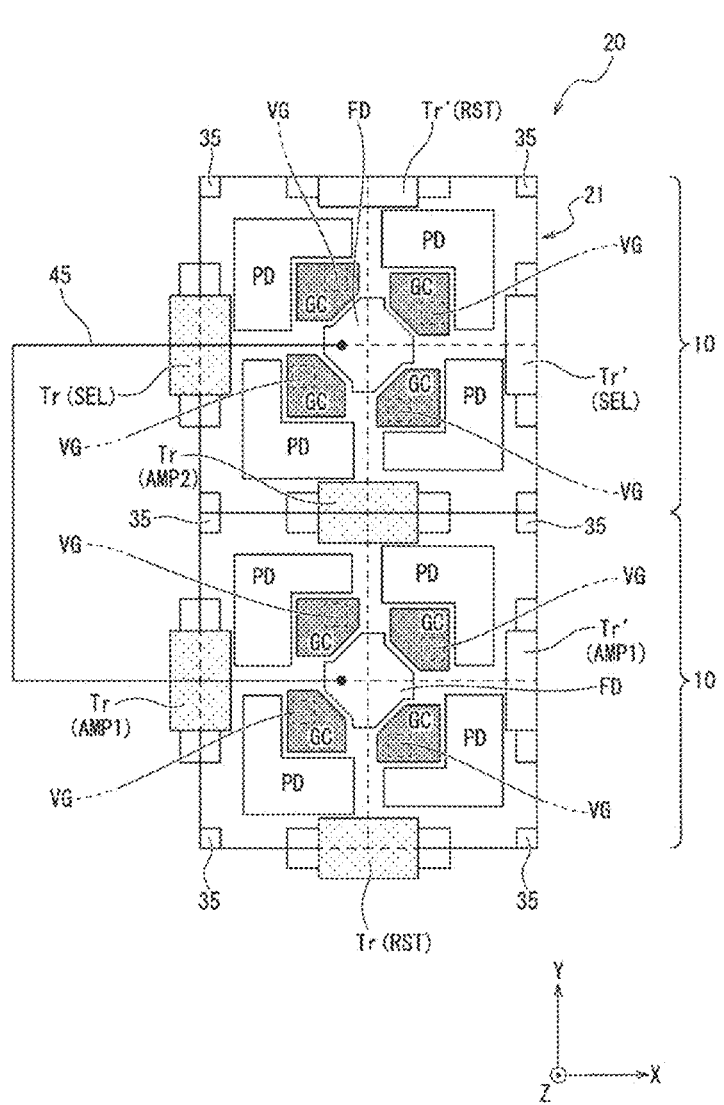
FIG. 13 is a plan view showing the configuration of a shared pixel unit according to the second embodiment of the present disclosure.

FIG. 13 is a plan view showing a configuration example of the shared pixel unit 20 according to the second embodiment of the present disclosure. FIG. 13 shows one substantially 2×4-type shared pixel unit 20 in which the floating diffusion FDs of two shared pixel units 10 that are vertically adjacent in a plan view are connected to each other by a wiring 45 disposed on the front surface 11a (see FIG. 5) side of the semiconductor substrate 11.

As shown in FIG. 13, in each shared pixel unit 10 constituting the 2×4-type shared pixel unit 20, the four transfer gates TG and the four photodiodes PD are each arranged non-linearly symmetrically and point-asymmetrically in a plan view. In each shared pixel unit 10, the outer peripheral edge of the shared floating diffusion FD also has a non-linearly symmetrical and point-symmetrical shape in a plan view. The center of point symmetry is the center portion of the shared pixel unit 10 in a plan view.

As a result, in the 2×4-type shared pixel unit 20 according to the second embodiment, the saddle points 49 (see FIGS.

6, 8, and 9) between adjacent pixels 21 can be dispersed similarly to the 2×2-type shared pixel unit 10 according to the first embodiment. For example, it is possible to suppress the saddle point 49 of the other pixel 21 from being modulated when the transfer gate of one pixel 21 is turned ON, and it is possible to suppress unintended fluctuations in Qs in the other pixel 21. In this way, it is possible to suppress deterioration in electrical characteristics due to unintended fluctuations in Qs. In addition, since it is easy to design the photodiode PD and the transfer gate TG to be widened toward the pixel boundary, layout efficiency can be improved.

Note that FIG. 13 shows a case where the pixel transistor Tr has two amplification transistors AMP1 and AMP2. In the 2×4-type shared pixel unit 20, the amplification transistors AMP1 and AMP2 are connected in parallel to each other. For example, the drains of the amplification transistors AMP1 and AMP2 are connected to the power supply potential VDD, and the sources of the amplification transistors AMP1 and AMP2 are connected to the drain of the selection transistor SEL. Furthermore, the gates of the amplification transistors AMP1 and AMP2 are connected to the floating diffusion FD via the wiring 45 or the like. In this way, the area of the amplification transistor AMP is increased.

MODIFIED EXAMPLE

(1) First Modified Example

Figure 14:
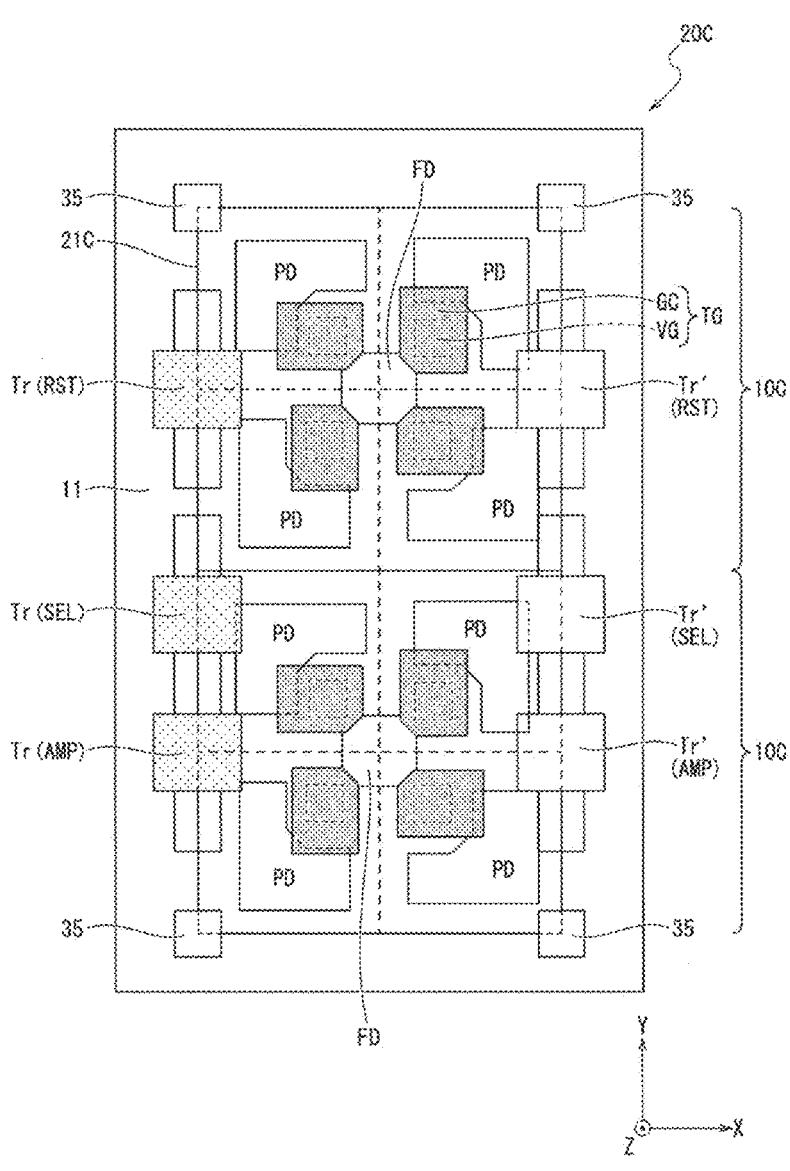
FIG. 14 is a plan view showing the configuration of a shared pixel unit according to a first modified example of the second embodiment of the present disclosure.

FIG. 14 is a plan view showing the configuration of a shared pixel unit 20C according to a first modified example of the second embodiment of the present disclosure. FIG. 14 shows a substantially 2×4-type shared pixel unit 20C in which the floating diffusion FDs of two shared pixel units 10C that are vertically adjacent in a plan view are connected by the wiring 45 (see FIG. 13). Note that one shared pixel unit 10C is composed of four pixels 21C.

As shown in FIG. 14, in each of the two shared pixel units 10C constituting the 2×4-type shared pixel unit 20C, a trench isolation 33 (see FIG. 5) is not arranged on the front surface 11a side of the semiconductor substrate 11. In each shared pixel unit 10C, the four transfer gates TG and the four photodiodes PD are arranged non-linearly symmetrically and point-symmetrically in a plan view. In each shared pixel unit 10C, the outer peripheral edge of the shared floating diffusion FD also has a non-linearly symmetrical and point-symmetrical shape in a plan view. The center of point symmetry is the center portion of the shared pixel unit 10C in a plan view.

On the other hand, in each shared pixel unit 10C, a portion of the pixel transistors Tr and Tr' and the contact region 35 are not arranged point-symmetrically.

Even with such a configuration, as in the case of the shared pixel unit 10 shown in FIG. 6 and the like, the arrangement of the saddle points 49 can be dispersed between adjacent pixels 21C, and unintended fluctuations in Qs can be suppressed. In this way, it is possible to suppress deterioration in electrical characteristics due to unintended fluctuations in Qs. Furthermore, since it is easy to design structures such as the photodiodes PD and the transfer gates TG to be widened toward the pixel boundary, layout efficiency can be improved.

(2) Second Modified Example

Figure 15:
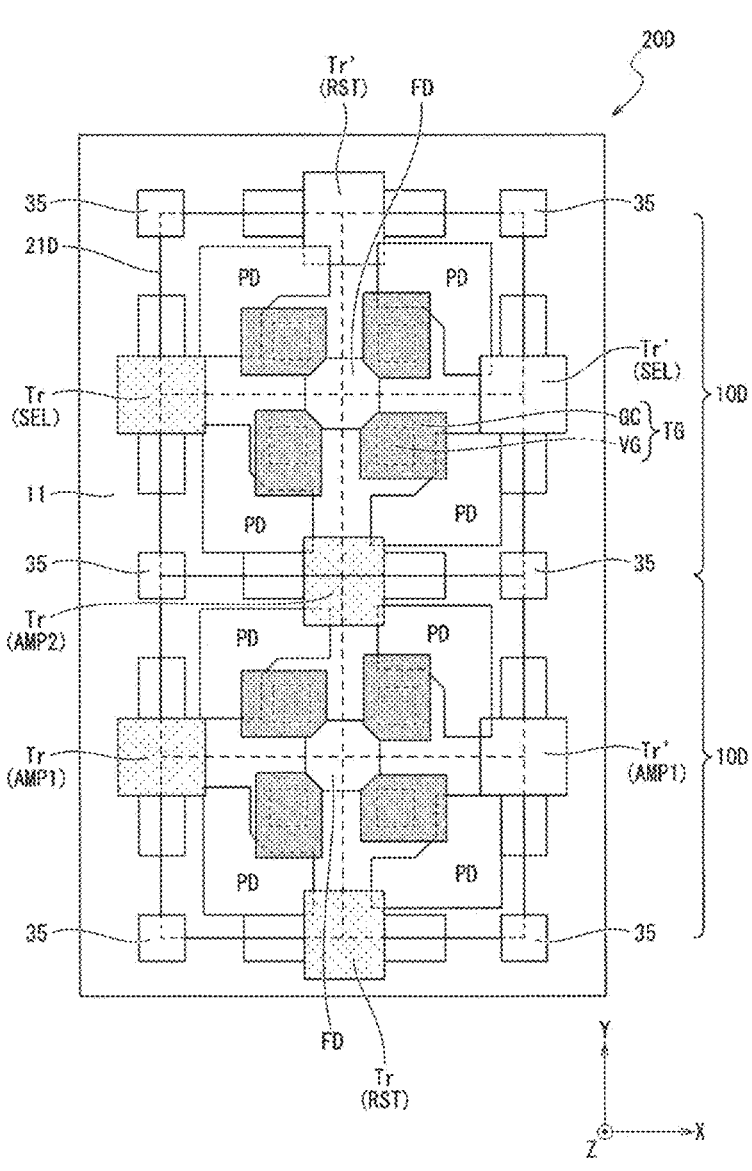
FIG. 15 is a plan view showing the configuration of a shared pixel unit according to a second modified example of the second embodiment of the present disclosure.

FIG. 15 is a plan view showing the configuration of a shared pixel unit 20D according to a second modified example of the second embodiment of the present disclosure. FIG. 15 shows a substantially 2×4-type shared pixel unit 20D in which the floating diffusion FDs of two shared pixel units 10D that are vertically adjacent in a plan view are connected by the wiring 45 (see FIG. 13). Note that one shared pixel unit 10D is composed of four pixels 21D.

As shown in FIG. 15, a trench isolation 33 (see FIG. 5) is not arranged on the front surface 11a side of the semiconductor substrate 11 in each of the two shared pixel units 10D that constitute the 2×4-type shared pixel unit 20D. In each shared pixel unit 10D, the four transfer gates TG and the four photodiodes PD are arranged non-linearly symmetrically and point-symmetrically in a plan view. In each shared pixel unit 10D, the outer peripheral edge of the shared floating diffusion FD also has a non-linearly symmetrical and point-symmetrical shape in a plan view. The center of point symmetry is the center portion of the shared pixel unit 10D in a plan view.

Furthermore, in each shared pixel unit 10D, the pixel transistors Tr and Tr' and the contact region 35 are arranged point-symmetrically.

Even with such a configuration, as in the case of the shared pixel unit 10 shown in FIG. 6 and the like, the arrangement of the saddle points 49 can be dispersed between adjacent pixels 21D, and unintended fluctuations in Qs can be suppressed. In this way, it is possible to suppress deterioration in electrical characteristics due to unintended fluctuations in Qs. Furthermore, since it is easy to design structures such as the photodiodes PD and the transfer gates TG to be widened toward the pixel boundary, layout efficiency can be improved.

(3) Third Modified Example

Figure 16:
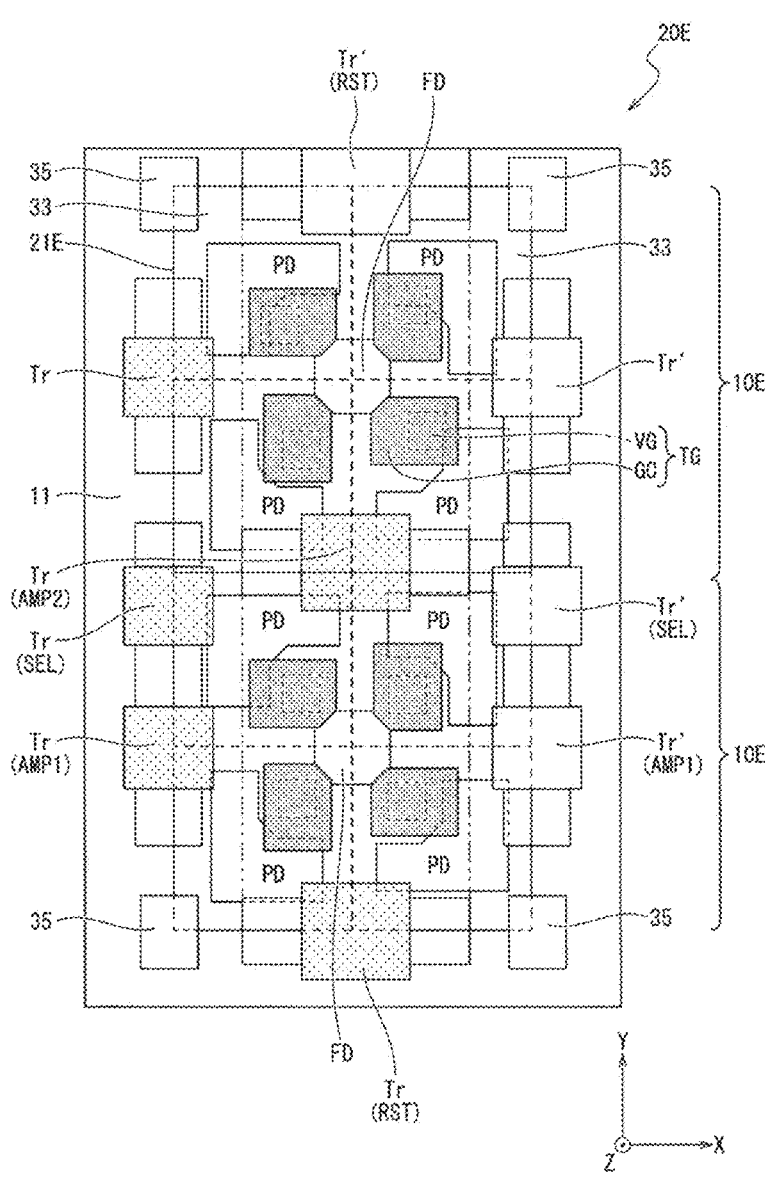
FIG. 16 is a plan view showing the configuration of a shared pixel unit according to a third modified example of the second embodiment of the present disclosure.

FIG. 16 is a plan view showing the configuration of a shared pixel unit 20E according to a third modified example of the second embodiment of the present disclosure. FIG. 16 shows a substantially 2×4-type shared pixel unit 20E in which the floating diffusion FDs of two shared pixel units 10E that are vertically adjacent in a plan view are connected by the wiring 45 (see FIG. 13). Note that one shared pixel unit 10E is composed of four pixels 21E.

As shown in FIG. 16, a trench isolation 33 is arranged on the front surface 11a side of the semiconductor substrate 11 in each of the two shared pixel units 10E constituting the 2×4-type shared pixel unit 20E. In each shared pixel unit 10E, the four transfer gates TG and the four photodiodes PD are arranged non-linearly symmetrically and point-symmetrically in a plan view. In each shared pixel unit 10E, the outer peripheral edge of the shared floating diffusion FD also has a non-linearly symmetrical and point-symmetrical shape in a plan view. The center of point symmetry is the center portion of the shared pixel unit 10E in a plan view.

On the other hand, in each shared pixel unit 10C, part of the pixel transistors Tr and Tr', the contact region 35, and the trench isolation 33 are not arranged point-symmetrically.

Even with such a configuration, as in the case of the shared pixel unit 10 shown in FIG. 6 and the like, the arrangement of the saddle points 49 can be dispersed between adjacent pixels 21E, and unintended fluctuations in Qs can be suppressed. In this way, it is possible to suppress deterioration in electrical characteristics due to unintended fluctuations in Qs. Furthermore, since it is easy to design structures such as the photodiodes PD and the transfer gates TG to be widened toward the pixel boundary, layout efficiency can be improved.

14

(4) Fourth Modified Example

Figure 17:
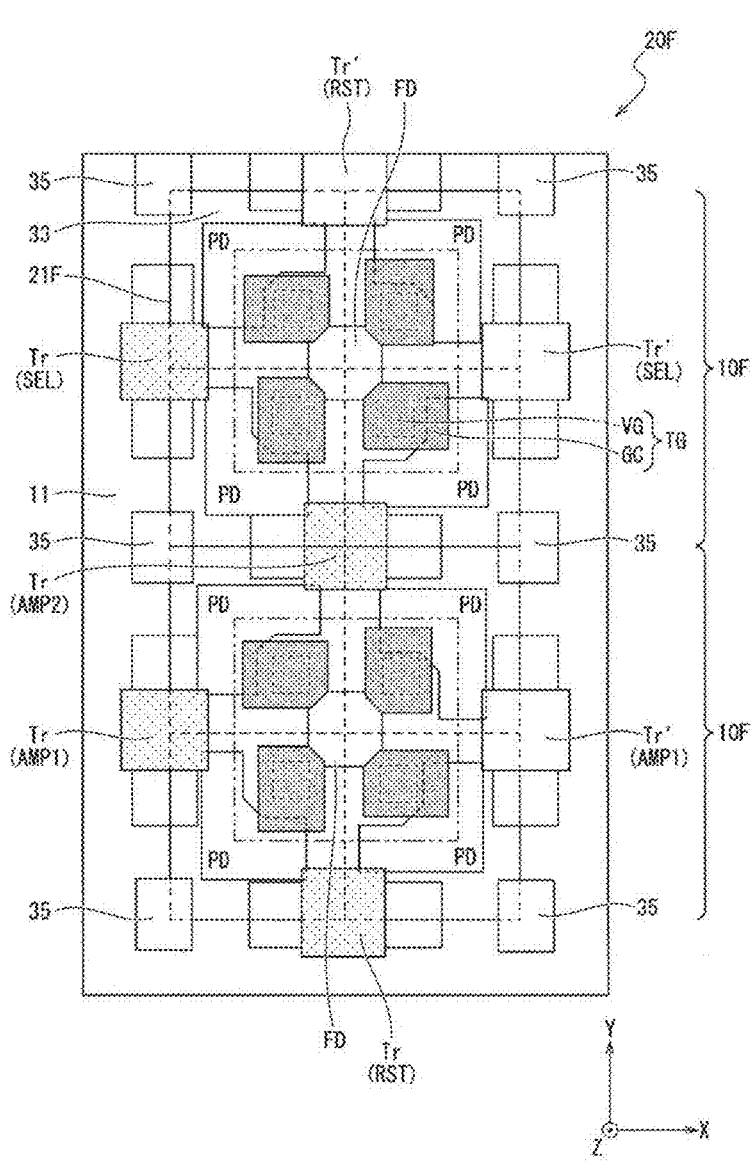
FIG. 17 is a plan view showing the configuration of a shared pixel unit according to a fourth modified example of the second embodiment of the present disclosure.

FIG. 17 is a plan view showing the configuration of a shared pixel unit 20F according to a fourth modified example of the second embodiment of the present disclosure. FIG. 17 shows a substantially 2×4-type shared pixel unit 20F in which the floating diffusion FDs of two shared pixel units 10F that are vertically adjacent in a plan view are connected by the wiring 45 (see FIG. 13). Note that one shared pixel unit 10F is composed of four pixels 21F.

As shown in FIG. 17, in each of the two shared pixel units 10F constituting the 2×4-type shared pixel unit 20E, a trench isolation 33 is arranged on the front surface 11a side of the semiconductor substrate 11. In each shared pixel unit 10F, the four transfer gates TG and the four photodiodes PD are arranged non-linearly symmetrically and point-symmetrically in a plan view. In each shared pixel unit 10F, the outer peripheral edge of the shared floating diffusion FD also has a non-linearly symmetrical and point-symmetrical shape in a plan view. The center of point symmetry is the center portion of the shared pixel unit 10F in a plan view.

Furthermore, in each shared pixel unit 10E, the pixel transistors Tr and Tr', the contact region 35, and the trench isolation 33 are arranged point-symmetrically.

Even with such a configuration, as in the case of the shared pixel unit 10 shown in FIG. 6 and the like, the arrangement of the saddle points 49 can be dispersed between adjacent pixels 21F, and unintended fluctuations in Qs can be suppressed. In this way, it is possible to suppress deterioration in electrical characteristics due to unintended fluctuations in Qs. In addition, since it is easy to design structures such as the photodiodes PD and the transfer gates TG to be widened toward the pixel boundary, layout efficiency can be improved.

(5) Fifth Modified Example

Figure 18:
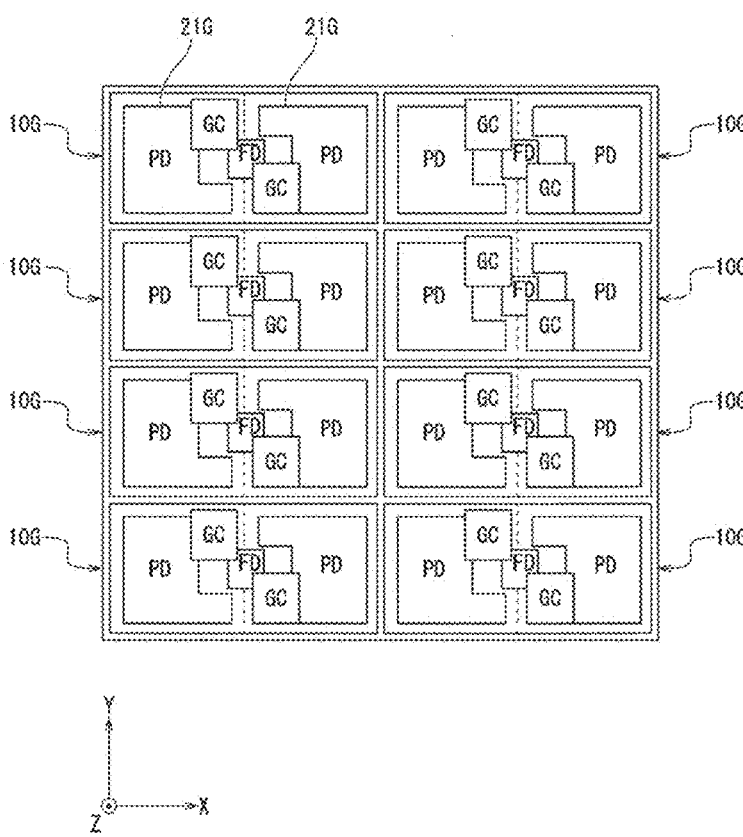
FIG. 18 is a plan view showing the configuration of a shared pixel unit according to a fifth modified example of the second embodiment of the present disclosure.

FIG. 18 is a plan view showing the configuration of a shared pixel unit 10G according to a fifth modified example of the second embodiment of the present disclosure. FIG. 18 shows a 2×1-type shared pixel unit 10G in which two horizontally adjacent pixels 21G in a plan view share a floating diffusion FD. As shown in FIG. 18, in this example, the transfer gate TG does not have the vertical gate electrode VG (see FIG. 3). The transfer gate TG is composed of only the horizontal gate electrode CG.

In the shared pixel unit 10G, the two horizontal gate electrodes CG and the two photodiodes PD are each arranged non-linearly symmetrically and point-symmetrically in a plan view. The center of point symmetry is the center portion of the shared pixel unit 10G in a plan view.

Even with such a configuration, as in the case of the shared pixel unit 10 shown in FIG. 6 and the like, the arrangement of the saddle points 49 can be dispersed between adjacent pixels 21G, and unintended fluctuations in Qs can be suppressed. In this way, it is possible to suppress deterioration in electrical characteristics due to unintended fluctuations in Qs. In addition, since it is easy to design the photodiode PD and the transfer gate TG to be widened toward the pixel boundary, layout efficiency can be improved.

(6) Sixth Modified Example

Figure 19:
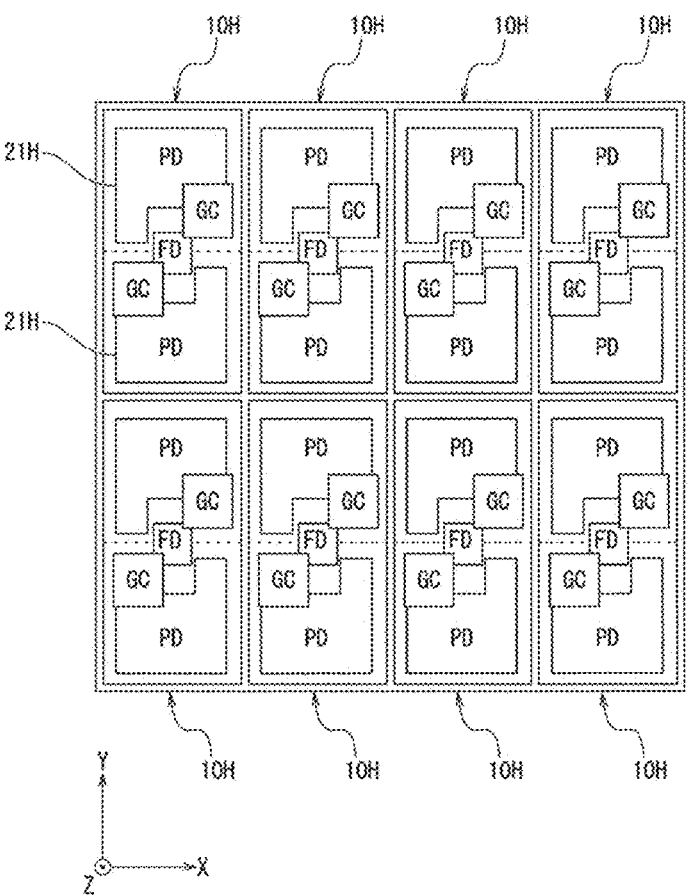
FIG. 19 is a plan view showing the configuration of a shared pixel unit according to a sixth modified example of the second embodiment of the present disclosure.

FIG. 19 is a plan view showing the configuration of a shared pixel unit 10H according to a sixth modified example of the second embodiment of the present disclosure. FIG. 19 shows a 1×2-type shared pixel unit 10H in which two vertically adjacent pixels 21H share a floating diffusion FD in a plan view. As shown in FIG. 19, in this example, the transfer gate TG does not have the vertical gate electrode VG (see FIG. 3). The transfer gate TG is composed of only the horizontal gate electrode CG.

In the shared pixel unit 10H, the two horizontal gate electrodes CG and the two photodiodes PD are each arranged non-linearly symmetrically and point-symmetrically in a plan view. The center of point symmetry is the center portion of the shared pixel unit 10H in a plan view.

Even with such a configuration, as in the case of the shared pixel unit 10 shown in FIG. 6 and the like, the arrangement of the saddle points 49 can be dispersed between adjacent pixels 21H, and unintended fluctuations in Qs can be suppressed. In this way, it is possible to suppress deterioration in electrical characteristics due to unintended fluctuations in Qs. In addition, since it is easy to design structures such as the photodiodes PD and the transfer gates TG to be widened toward the pixel boundary, layout efficiency can be improved.

Other Embodiments

While the present disclosure has been described on the basis of the embodiment and modified examples as described above, the descriptions and figures that constitute parts of the present disclosure should not be understood as limiting the present disclosure. Various alternative embodiments, examples, and operable techniques will be apparent to those skilled in the art from the present disclosure. For example, similarly to the fifth and sixth modified examples of the second embodiment, in the first embodiment and the first and second modified examples thereof, and in the second embodiment and the first to fifth modified examples thereof, the vertical gate electrode VG may not be provided in the transfer gate TG. The transfer gate TG may be composed of only the horizontal gate electrode CG. Furthermore, in the fifth and sixth modified examples of the second embodiment, the transfer gate TG may be composed of both the vertical gate electrode VG and the horizontal gate electrode CG. The configurations of the first and second embodiments may be arbitrarily combined to form the configuration of the embodiment of the present disclosure.

In this way, it is of course that the present technology includes various embodiments and the like that are not described herein. At least one of various omissions, substitutions and modified examples of components may be performed without departing from the gist of the embodiments and the modified examples described above. Furthermore, the effects described in the present description are merely exemplary and not intended to be limiting, and other effects may be provided as well.

The present disclosure can also be configured as follows.

(1)
An imaging device including:
a semiconductor layer; and
a plurality of pixels provided in the semiconductor layer, each of the plurality of pixels including:
a photoelectric conversion unit;
a floating diffusion that converts a charge generated by the photoelectric conversion unit into a voltage signal; and
a transfer transistor that transfers the charge generated in the photoelectric conversion unit to the floating diffusion, wherein
in one pixel and the other pixel that are adjacent to each other among the plurality of pixels, one or more of the photoelectric conversion unit, the floating diffusion, and the transfer transistor are arranged non-linearly symmetrically and point-symmetrically.

(2)
The imaging device according to (1), wherein the one pixel and the other pixel share the floating diffusion.

(3)
The imaging device according to (1) or (2), wherein each of the plurality of pixels further includes:
an inter-pixel separation portion provided in the semiconductor layer, and
a part of a gate electrode of the transfer transistor is disposed at a position adjacent to the pixel separation portion or at a position overlapping the pixel separation portion in a plan view from a normal direction of a first surface of the semiconductor layer.

(4)
The imaging device according to (3), wherein the gate electrode of the transfer transistor includes:
a first portion embedded in the semiconductor layer from the first surface side of the semiconductor layer; and
a second portion provided on the first surface of the semiconductor layer and connected to the first portion, and
the first portion is arranged at a position adjacent to the pixel separation portion or at a position overlapping the pixel separation portion.

(5)
The imaging device according to (3) or (4), wherein the pixel separation portion includes a trench isolation.

(6)
The imaging device according to (2), wherein a gate electrode of the transfer transistor includes:
a first portion embedded in the semiconductor layer from a first surface side of the semiconductor layer; and
a second portion provided on the first surface of the semiconductor layer and connected to the first portion, and
the first portion is arranged at a position away from the shortest straight line connecting a center portion of the pixel and the floating diffusion in a plan view from a normal direction of the first surface.

(7)
The imaging device according to (6), wherein the first portion has a side surface along the shortest straight line.

REFERENCE SIGNS LIST

1 Imaging device
10, 10A, 10B, 10C, 10D, 10E, 10F, 10G, 10H, 10r Shared pixel unit
20, 20C, 20D, 20E, 20F Shared pixel unit
10c, 10rc, 21Bc Center portion
Center portion
11 (First) Semiconductor substrate
11a Front surface
12 Pixel region
13 Vertical drive circuit
14 Column signal processing circuit
15 Horizontal drive circuit
16 Output circuit
17 Control circuit
21, 21A, 21C, 21D, 21E, 21F, 21G, 21H Pixel
22 Horizontal signal line
23 Vertical signal line
24 Data output signal line 30 Readout circuit
31 Well region
33 Trench isolation
35 Contact region
37 Gate insulating film
40 Inter-pixel separation portion
41 Impurity diffusion layer
43 Trench isolation
45 Wiring
49 Saddle point
AMP, AMP1, AMP2 Amplification transistor
CG Horizontal gate electrode
CNT Center portion
FD Floating diffusion
GC Horizontal gate electrode
H1 Hole
L Shortest straight line
ON Transfer gate
PD, PDr Photodiode
RST Reset transistor
SEL Selection transistor
TG, TGr Transfer gate
Tr Pixel transistor
TR Transfer transistor
Vdd Power line
VDD Power supply potential
VG Vertical gate electrode
W, Wr Interval

What is claimed is:

1. An imaging device, comprising:

a semiconductor layer; and a plurality of pixels provided in the semiconductor layer, each of the plurality of pixels including:

a photoelectric conversion unit;

a floating diffusion that converts a charge generated by the photoelectric conversion unit into a voltage signal; and a transfer transistor that transfers the charge generated in the photoelectric conversion unit to the floating diffusion, wherein, in a first pixel and a second pixel that are adjacent to each other among the plurality of pixels,- one or more of the photoelectric conversion unit, the floating diffusion, and the transfer transistor are arranged non-linearly symmetrically and point-symmetrically, wherein the first pixel and the second pixel share the floating diffusion, wherein a gate electrode of the transfer transistor includes:

a first portion embedded in the semiconductor layer from a first surface side of the semiconductor layer; and a second portion provided on the first surface of the semiconductor layer and connected to the first portion, and wherein the first portion is arranged at a position away from a shortest straight line connecting a center portion of the pixel and the floating diffusion in a plan view from a normal direction of the first surface.

2. The imaging device according to claim 1, wherein each of the plurality of pixels further includes:

an inter-pixel separation portion provided in the semiconductor layer, and a part of a gate electrode of the transfer transistor is disposed at a position adjacent to the pixel separation portion or at a position overlapping the pixel separation portion in a plan view from a normal direction of a first surface of the semiconductor layer.

3. The imaging device according to claim 2, wherein the pixel separation portion includes a trench isolation.

4. The imaging device according to claim 1, wherein the first portion has a side surface along the shortest straight line.

* * * * *